US006919983B2

(12) United States Patent
Kowarz

(10) Patent No.: US 6,919,983 B2
(45) Date of Patent: Jul. 19, 2005

(54) MICROELECTROMECHANICAL DEVICE WITH CONTINUOUSLY VARIABLE DISPLACEMENT

(75) Inventor: Marek W. Kowarz, Henrietta, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 10/985,514

(22) Filed: Nov. 10, 2004

(65) Prior Publication Data

US 2005/0094243 A1 May 5, 2005

Related U.S. Application Data

(63) Continuation of application No. 10/253,747, filed on Sep. 24, 2002, now Pat. No. 6,844,960.

(51) Int. Cl.[7] ................... G02B 26/00; G02B 26/08; G02B 26/02; G02B 5/18; G09G 3/34
(52) U.S. Cl. ................... 359/290; 359/291; 359/295; 359/224; 359/228; 359/231; 359/566; 359/573; 345/84; 349/158; 385/37
(58) Field of Search ................... 359/290, 291, 359/295, 298, 245, 214, 224, 228, 221, 223, 231, 558, 566, 573, 572, 318, 569; 345/55, 84; 349/158; 385/37

(56) References Cited

U.S. PATENT DOCUMENTS

| | | | | |
|---|---|---|---|---|
| 5,303,081 A | * | 4/1994 | Totsuka et al. | 359/213 |
| 6,061,166 A | * | 5/2000 | Furlani et al. | 359/254 |
| 6,144,481 A | | 11/2000 | Kowarz et al. | 359/291 |
| 6,215,579 B1 | | 4/2001 | Bloom et al. | 359/298 |
| 6,307,663 B1 | | 10/2001 | Kowarz | 359/231 |
| 6,329,738 B1 | | 12/2001 | Hung et al. | 310/309 |
| 6,346,977 B1 | * | 2/2002 | Westerman | 349/158 |
| 6,362,018 B1 | | 3/2002 | Xu et al. | 438/50 |
| 6,419,335 B1 | | 7/2002 | Gooray et al. | 347/9 |
| 6,603,902 B1 | * | 8/2003 | So | 385/37 |
| 6,639,722 B2 | * | 10/2003 | Amm et al. | 359/571 |
| 6,700,556 B2 | * | 3/2004 | Richley et al. | 345/84 |
| 6,702,483 B2 | * | 3/2004 | Tsuboi et al. | 396/449 |
| 6,714,337 B1 | * | 3/2004 | Amm | 359/290 |
| 6,717,715 B2 | * | 4/2004 | Holl et al. | 359/291 |
| 6,724,515 B1 | * | 4/2004 | Kowarz | 359/290 |
| 6,822,797 B1 | * | 11/2004 | Carlisle et al. | 359/572 |
| 6,829,092 B2 | * | 12/2004 | Amm et al. | 359/573 |
| 6,844,960 B2 | * | 1/2005 | Kowarz | 359/298 |

OTHER PUBLICATIONS

Elmer S. Hung and Stephen D. Senturia, "Extending the Travel Range of Analog–Tuned Electrostatic Actuators" Journal Of Microelectromechanical Systems, vol. 8, No. 4, Dec. 1999.

Michael S.–C. Lu, et al., "Closed–Loop Control of a Parallel–Plate Microactuator Beyond The Pull–in Limit" Solid–State Sensor, Actuator and Microsystems Workshop, Jun. 2–6, 2002, pp. 255–258.

* cited by examiner

*Primary Examiner*—Loha Ben
(74) *Attorney, Agent, or Firm*—Stephen H. Shaw

(57) ABSTRACT

An electrostatic micromechanical device with continuously variable displacement, that includes: a movable member having a first electrode; an opposing surface having a second electrode; a channel separating the movable member from the opposing surface; a liquid situated in the channel, wherein the liquid has a sufficiently high dielectric constant so as to enable continuously variable and stable control of a displacement of the movable member over a travel range spanning at least half of the channel; the displacement being a result of a voltage applied between the first electrode and the second electrode; and at least one solid dielectric layer physically situated between the first electrode and the second electrode.

24 Claims, 10 Drawing Sheets

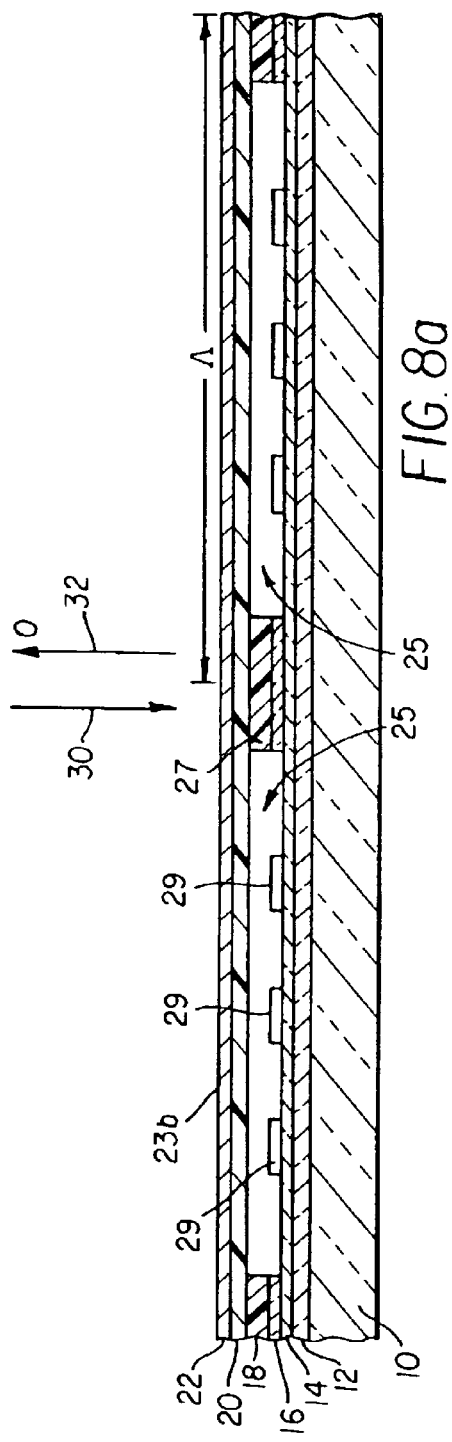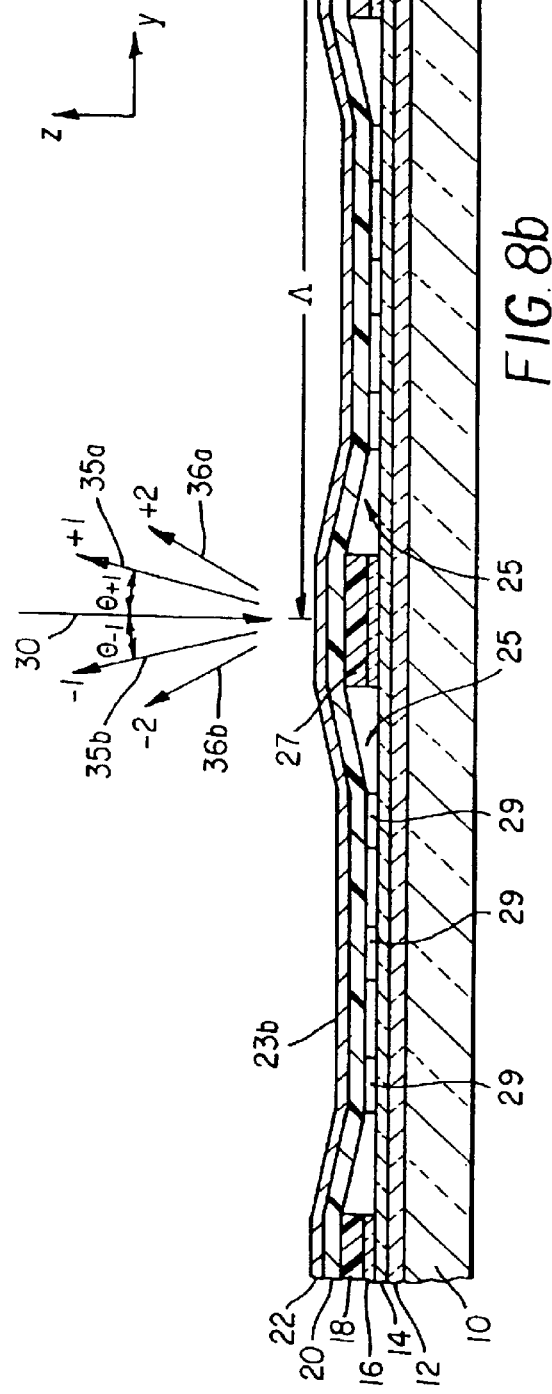

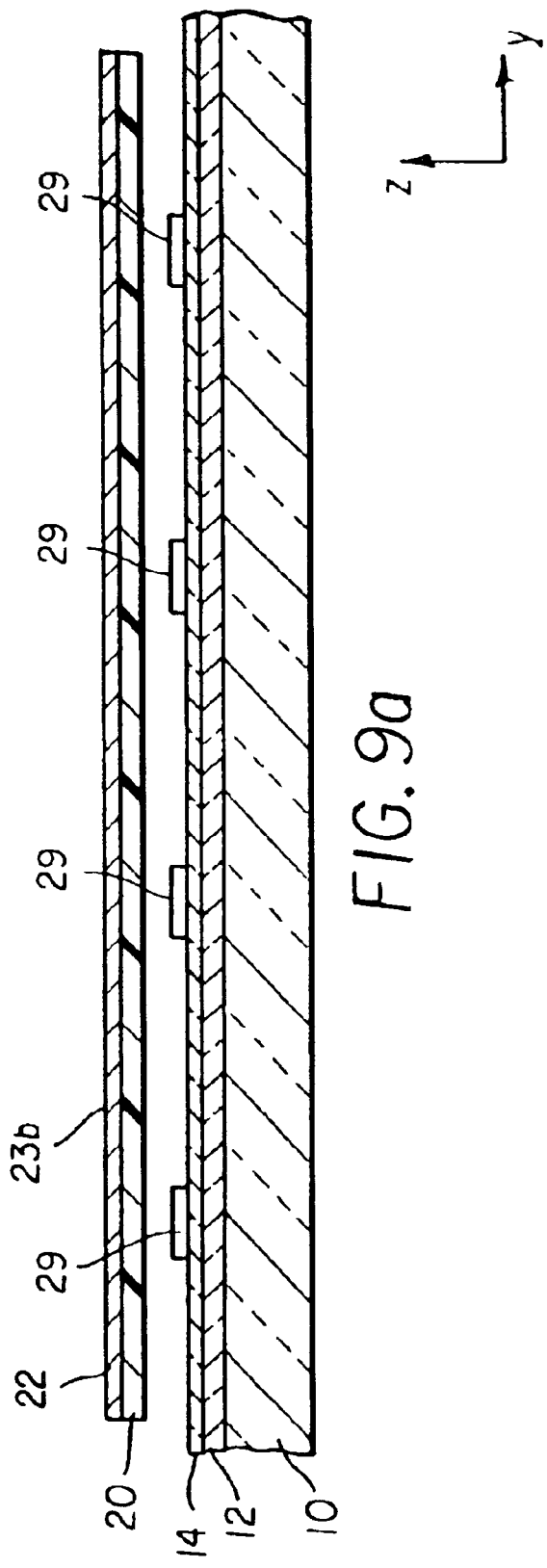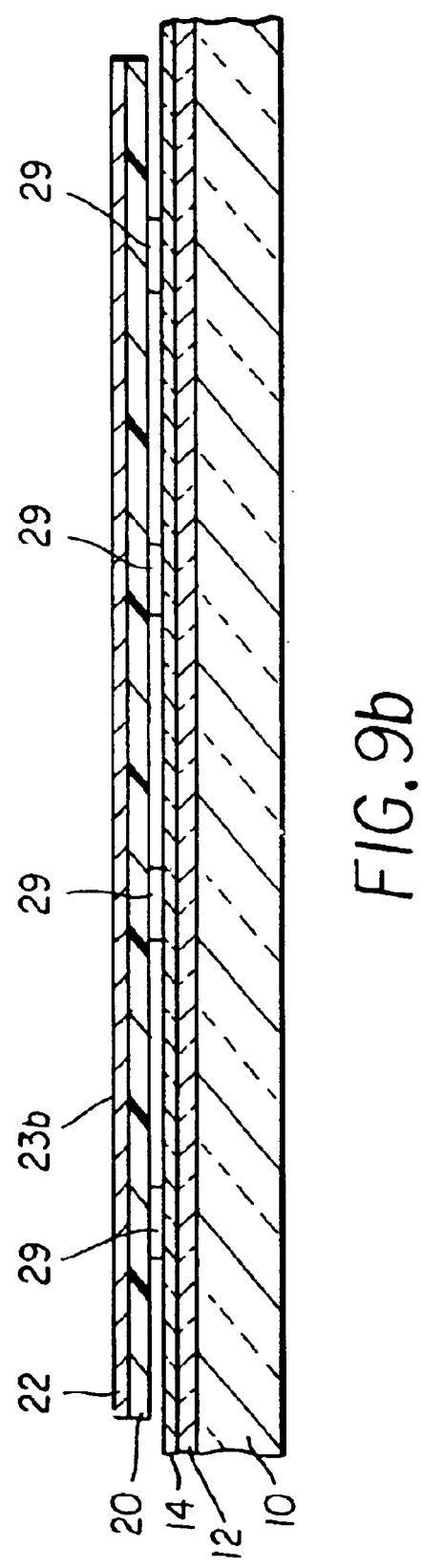

MICROELECTROMECHANICAL DEVICE WITH CONTINUOUSLY VARIABLE DISPLACEMENT

CROSS-REFERENCE TO RELATED APPLICATIONS

This is a continuation of U.S. application Ser. No. 10/253,747, filed on 24 Sep. 2002 now U.S. Pat. No. 6,844,960 by Marek W. Kowarz, and entitled "Microelectromechanical Device with Continuously Variable Displacement", now U.S. Pat. No. 6,844,960, wherein this patent is incorporated by reference herein.

FIELD OF THE INVENTION

The present invention relates to electrostatic microelectromechanical devices, and more particularly to microelectromechanical devices with movable members requiring continuously variable and stable displacement over a large travel range.

BACKGROUND OF THE INVENTION

Many different types of microelectromechanical (MEMS) devices, such as variable capacitors, electromechanical gratings and mirrors, inkjet printheads, and a variety of sensors, rely on electrostatic forces between two electrodes to produce controlled actuation of a movable member. However, as is well known, continuous control of the displacement of the movable member is only possible over a fraction (approximately ⅓) of the distance between the two electrodes because of the nonlinear nature of the electrostatic forces. Once the displacement exceeds this fraction, "pull-in" or "Pull-down" occurs, whereby the nonlinear electrostatic force completely overwhelms the mechanical restoring force of the member.

Different approaches have been used to produce continuously variable displacement in electrostatic MEMS devices while avoiding the pull-down instability. The most straightforward is to design the device with a large enough separation between the two electrodes, thereby enabling sufficient displacement before reaching the instability point. This approach has been used by Silicon Light Machines in their analog Grating Light Valve (GLV), as described by Bloom et al. in U.S. Pat. No. 6,215,579, entitled Method and Apparatus for Modulating an Incident Light Beam for Forming a Two-Dimensional Image, issued Apr. 10, 2001. To avoid high operating voltages caused by increased electrode separation, these analog GLVs are specifically designed to have low mechanical restoring forces. Alternatively, a more complex structural design can be used in an electromechanical grating to obtain continuous actuation over a larger travel range, as described by Hung et al. in U.S. Pat. No. 6,329,738, entitled Precision Electrostatic Actuation And Positioning, issued Dec. 11, 2001 and in E. S. Hung and S. D. Senturia, "Extending the Travel Range of Analog-Tuned Electrostatic Actuators," Journal of Microelectromechanical Systems, vol. 8, No. 4, pgs. 497–505 (1999). Another alternative is described in U.S. Pat. No. 6,362,018, entitled Method for Fabricating MEMS Variable Capacitor with Stabilized Electrostatic Drive, by Xu et al., issued Mar. 26, 2002, whereby a fixed series capacitor is added to a variable MEMS capacitor in order to extend the electromechanical tunability of the variable capacitor. A disadvantage of this last approach is that the required actuation voltage is raised significantly.

Recently, an electromechanical conformal grating device, an optical MEMS device consisting of ribbon elements suspended above a substrate by a periodic sequence of intermediate supports was disclosed by Kowarz in U.S. Pat. No. 6,307,663, entitled Spatial Light Modulator With Conformal Grating Device, issued Oct. 23, 2001. The electromechanical conformal grating device is operated by electrostatic actuation, which causes the ribbon elements to conform around the support substructure, thereby producing a grating. The device of '663 has more recently become known as the conformal GEMS device, with GEMS standing for grating electromechanical system. The conformal GEMS device provides high-speed light modulation with high contrast, good efficiency and digital operation. However, for applications that require amplitude modulation of light intensity, analog operation with continuous control of the displacement of the ribbon elements is needed. In addition, the approaches mentioned earlier for producing continuously variable displacement while avoiding the pull-down instability are ill-suited for the conformal GEMS device.

There is a need, therefore, for an electrostatic microelectromechanical device that has a continuously variable displacement and avoids the problems noted above.

SUMMARY OF THE INVENTION

The above need is met according to the present invention by providing an electrostatic micromechanical device with continuously variable displacement, that includes: a movable member having a first electrode; an opposing surface having a second electrode; a channel separating the movable member from the opposing surface; a liquid situated in the channel, wherein the liquid has a sufficiently high dielectric constant so as to enable continuously variable and stable control of a displacement of the movable member over a travel range spanning at least half of the channel; the displacement being a result of a voltage applied between the first electrode and the second electrode; and at least one solid dielectric layer physically situated between the first electrode and the second electrode.

BRIEF DESCRIPTION OF THE DRAWINGS

FIGS. 8a and 8b are cross-sectional views through line 8—8 in FIG. 7, showing the operation of a conformal GEMS device in an unactuated state and a fully actuated state, respectively.

FIGS. 9a and 9b are cross-sectional views through line 9—9 in FIG. 7, showing the conformal GEMS device in an unactuated state and a fully actuated state, respectively.

DETAILED DESCRIPTION OF THE INVENTION

In its broadest embodiment, the present invention increases the usable travel range of a variety of movable members used in electrostatic microelectromechanical (MEMS) devices. Within the usable travel range, the displacement of the movable members is continuously variable and stable. Although the invention is described primarily for the specific case of an electrostatic MEMS device with one or more tensile ribbon elements, it will be apparent to those skilled in the art that the invention also pertains to devices containing other microelectromechanical structures. These movable members can include, for example, singly-clamped beams, doubly-clamped beams, membranes or rigid plates on torsional hinges. Furthermore, multiple movable members can be used to create more complex moving structures, such as electrostatic comb drives or electromechanical gratings.

Figure 1A:
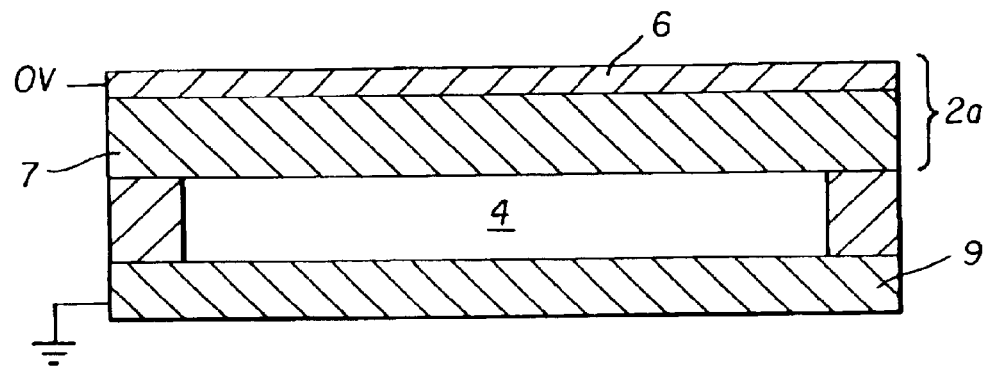
FIG. 1a is a cross-sectional view of a prior art tensile ribbon element in an unactuated state.
Figure 1B:
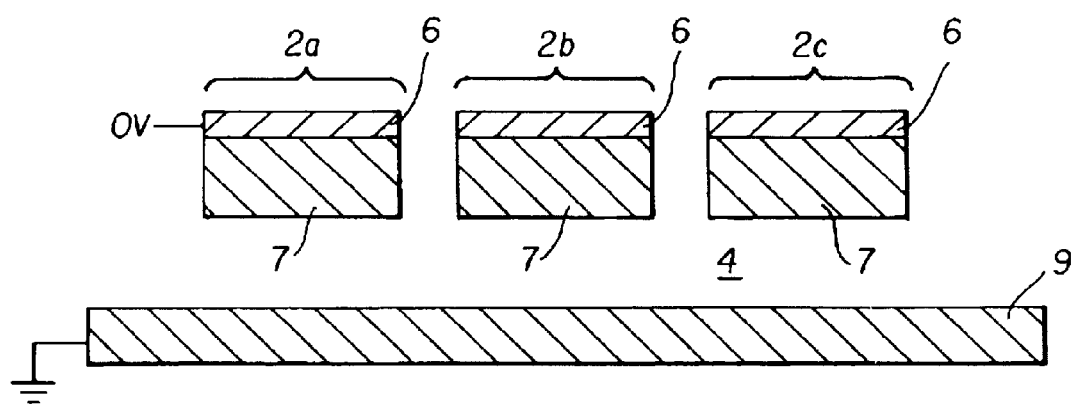
FIG. 1b is a rotated cross-sectional view of (prior art) three parallel tensile ribbon elements in an unactuated state.

FIG. 1a illustrates the cross-section of a typical tensile ribbon element 2a that is a movable member in a MEMS device. Tensile stress in the dielectric ribbon material 7 keeps the tensile ribbon element 2a separated from the opposing surface, a conducting substrate 9. The channel 4 is usually evacuated or filled with an inert gas atmosphere, such as nitrogen or a nobel gas. To deform the ribbon into the channel 4, a voltage is applied between the first electrode 6 and the conducting substrate 9, which serves as the second electrode. In FIGS. 1a and 1b, the applied voltage is zero. FIG. 1b shows a rotated cross-section of the same tensile ribbon element 2a with two neighboring elements 2b and 2c.

Figure 2A:
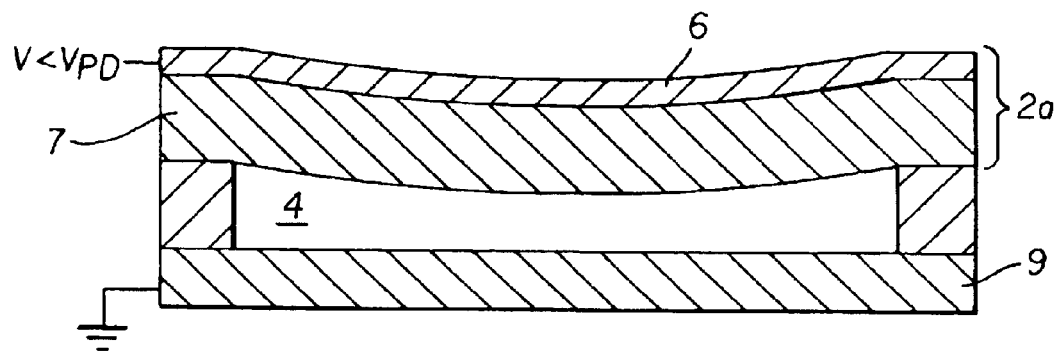
FIG. 2a is a cross-sectional view of a prior art tensile ribbon element in a partially actuated state.
Figure 2B:
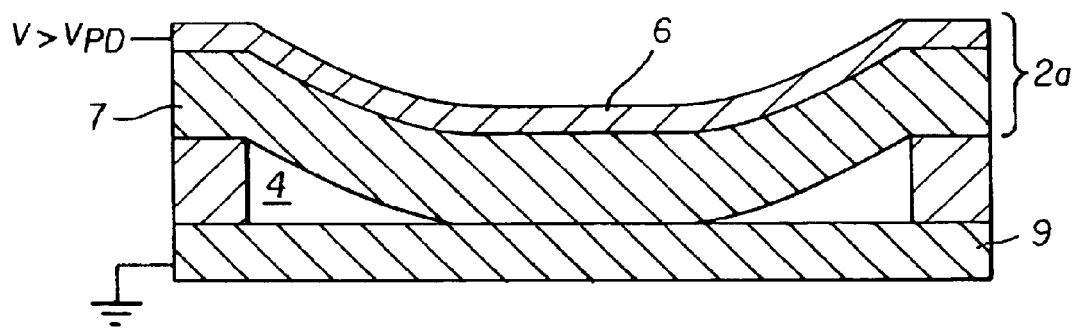
FIG. 2b is a cross-sectional view of a prior art tensile ribbon element in a fully actuated state.

FIGS. 2a and 2b show cross-sectional views of the tensile ribbon element 2a, with a voltage applied between the first electrode 6 and the conducting substrate 9. When the applied voltage is slightly below the pull-down voltage $V_{PD}$, the tensile ribbon element 2a is suspended as illustrated in FIG. 2a Once the applied voltage exceeds $V_{PD}$, the nonlinear electrostatic force completely overwhelms the tensile restoring force. The tensile ribbon element 2a then snaps into contact with the conducting substrate 9, producing the ribbon profile shown in FIG. 2b. As already mentioned, it is not possible to produce continuously variable profiles for applied voltages close to $V_{PD}$.

In the present invention, the channel 4 is filled with a liquid that has a high dielectric constant and can withstand high electrostatic fields. By careful selection of this liquid, the pull-down instability can be eliminated, thereby enabling continuously variable and stable displacement of the tensile ribbon element 2a over a travel range spanning the entire channel 4.

The dielectric constant requirements for the liquid can be established by considering the effective electrostatic thickness t of the device. Including the effect of the liquid-filled channel 4, the effective electrostatic thickness t of the layers between the first electrode 6 and the conducting substrate 9 is given by the expression $$t = d_c + \in t_\in,$$

where $$t_\varepsilon = \sum_m \frac{t_m}{\varepsilon_m}$$

is the total dielectric thickness of the solid dielectrics; $d_c$ is the depth of the channel 4; and $\in$ is the dielectric constant of the liquid. In the total dielectric thickness $t_m$ the summation is over all solid dielectrics between the two electrodes with the thickness $t_m$ of each solid dielectric reduced by its dielectric constant $\in_m$. It can be shown that the tensile ribbon element 2a can be displaced smoothly throughout a travel range spanning the entire channel 4 if the depth of the channel $d_c$ is less than approximately 0.388t. To satisfy this requirement, the dielectric constant of the liquid should satisfy the inequality $$\in > 1.58 d_c/t_\in \quad \text{(Equation 1)}$$

A liquid that satisfies Equation 1 eliminates the pull-down instability, thereby allowing for a continuously variable and stable displacement over the entire depth of the channel 4. Liquids with lower dielectric constants can be used to increase the travel range beyond what is usually possible with a gas-filled or evacuated channel 4. Such lower dielectric constant liquids are still considered to be within the scope of this invention.

Figure 3A:
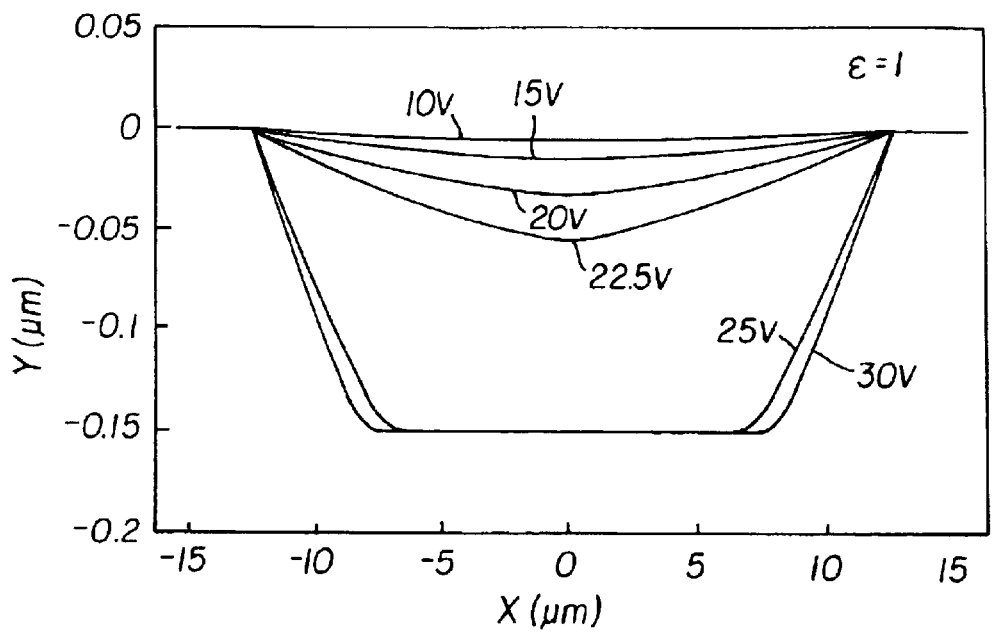
FIG. 3a shows the profile of a prior art ribbon element in a gas atmosphere for various actuation voltages.

FIGS. 3a through 5 illustrate the use of a liquid to eliminate the pull-down instability of a tensile ribbon element. In this example, the channel depth $d_c$ is 150 nanometers and the total dielectric thickness $t_\in$ is 24 nanometers. Based on Equation 1, a liquid with a dielectric constant of greater than 9.8 enables travel range spanning the entire channel 4. FIG. 3a shows a plot of the ribbon profile as a function of increasing voltage for a gas-filled channel ($\in=1$). The change in ribbon profile is discontinuous and unstable near the pull-down voltage $V_{PD}=22.6$ V. FIG. 3b shows the same device with the channel 4 filled with a liquid with $\in=18$. A continuously variable deflection and stable deflection can now be obtained over a travel range spanning the entire channel 4, with only a slight increase in voltage required.

Figure 3B:
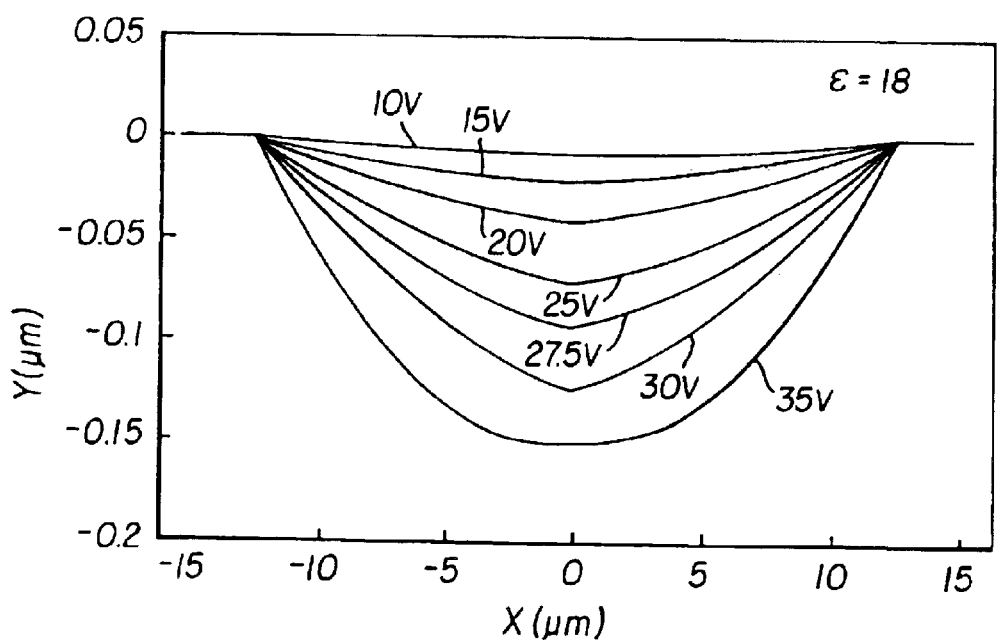
FIG. 3b shows the profile of a ribbon element immersed in a liquid with a high dielectric constant for various actuation voltages.
Figure 4A:
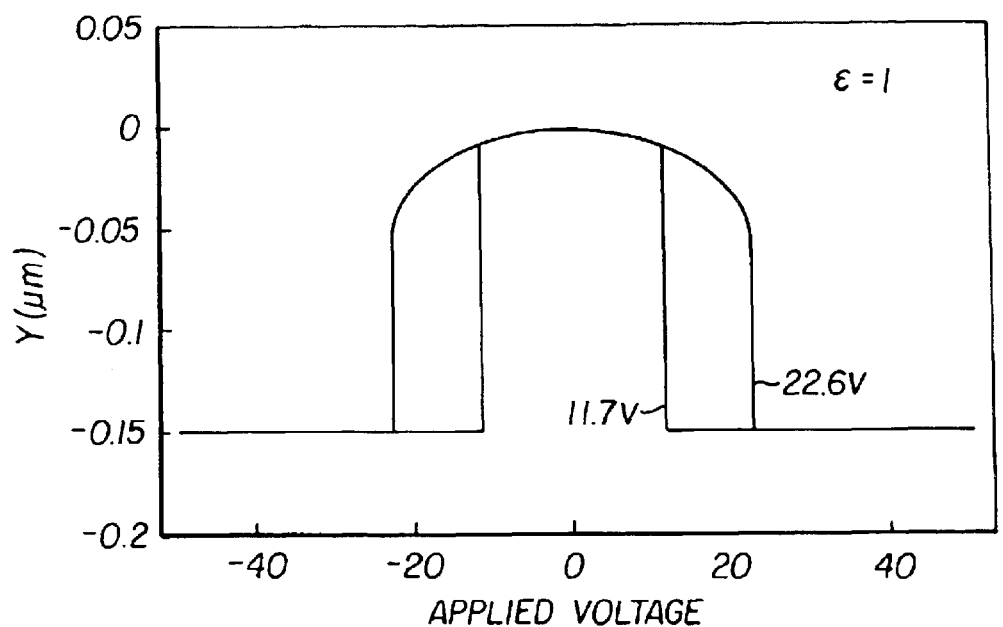
FIG. 4a shows a plot of the midpoint deflection of a ribbon element in a gas atmosphere as a function of applied voltage, illustrating the presence of pull-down and release instabilities.
Figure 4B:
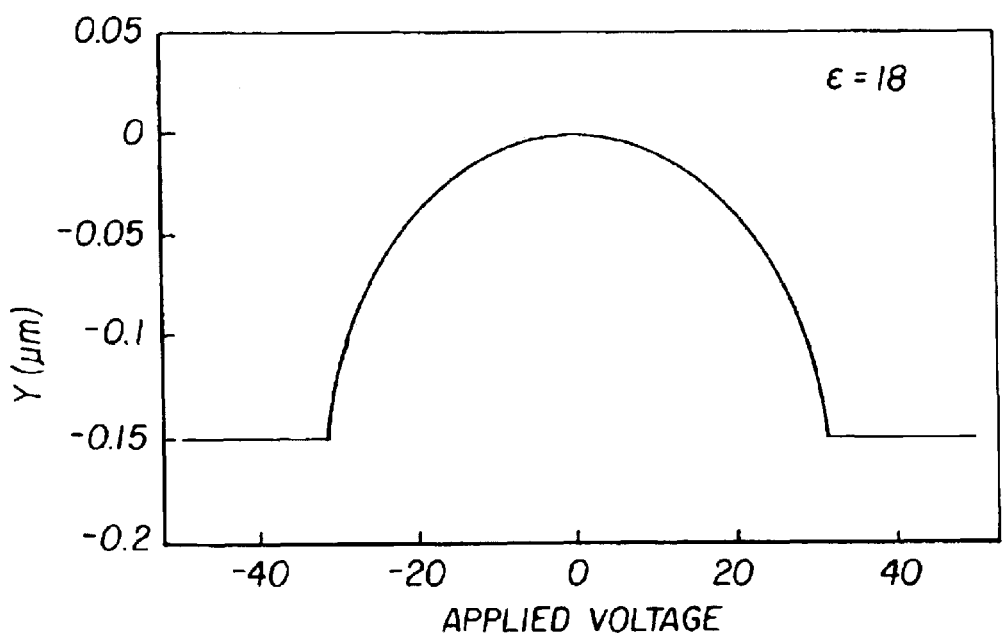
FIG. 4b shows a plot of the midpoint deflection of a ribbon element in a liquid with a high dielectric constant as a function of applied voltage, illustrating the elimination of pull-down and release instabilities.

FIGS. 4a and 4b compare the deflection at the midpoint of a ribbon as a function of voltage for the gas-filled and liquid-filled devices of FIGS. 3a and 3b, respectively. For the gas-filled device (FIG. 4a), as the voltage is increased from zero, the midpoint displacement increases continously until the voltage reaches the pull-down voltage of 22.6 V. At this point, the ribbon slams into the substrate, and further increases in voltage changes the ribbon's profile as depicted in FIG. 3a. With the ribbon now in contact with the substrate, the voltage can be decreased below the pull-down voltage while maintaining contact. At the release voltage $V_{RL}$ of 11.7 V, the tensile stress overcomes the electrostatic attraction and the ribbon is released from the substrate. This type of hysteresis curve is well-known in electrostatic MEMS devices and is often used to describe the instability associated with electrostatic actuation. As shown in FIG. 4a, the response is identical for negative applied voltages.

For the liquid-filled device (∈=18), the midpoint displacement is a smooth function of applied voltage as shown in FIG. 4b. The instabilities associated with the critical pull-down and release voltages are absent and the hysteresis disappears.

Figure 5:
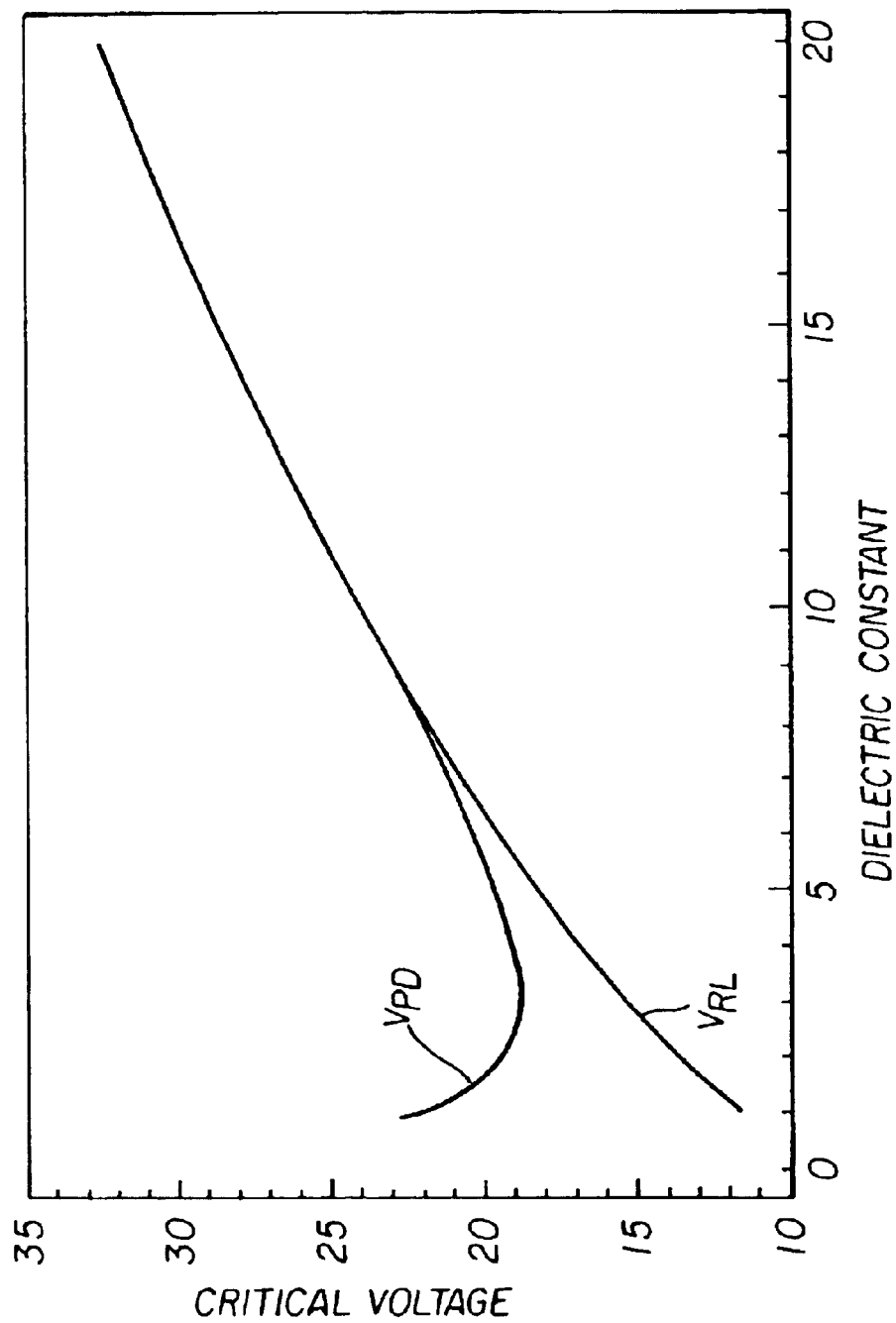
FIG. 5 shows a plot of the critical voltages of a ribbon element in liquid as a function of the liquid dielectric constant.

FIG. 5 is a plot of the two critical voltages, $V_{PD}$ and $V_{RL}$, as a function of the dielectric constant of the liquid. When these two voltages become equal, i.e., when ∈=9.8 for this example, the travel range spans the entire depth of the channel 4. Further increasing the dielectric constant reduces the sensitivity of displacement to voltage, thereby improving the ability to control displacement.

As is well known, tensile ribbon elements, such as those discussed above, are basic building blocks that can be used to form more complex MEMS devices. For example, large numbers of parallel ribbon elements can be used to produce electromechanical gratings, such as the conformal GEMS device or the GLV. Individual ribbon elements can be used to make variable capacitors or capacitive sensors.

Figure 6:
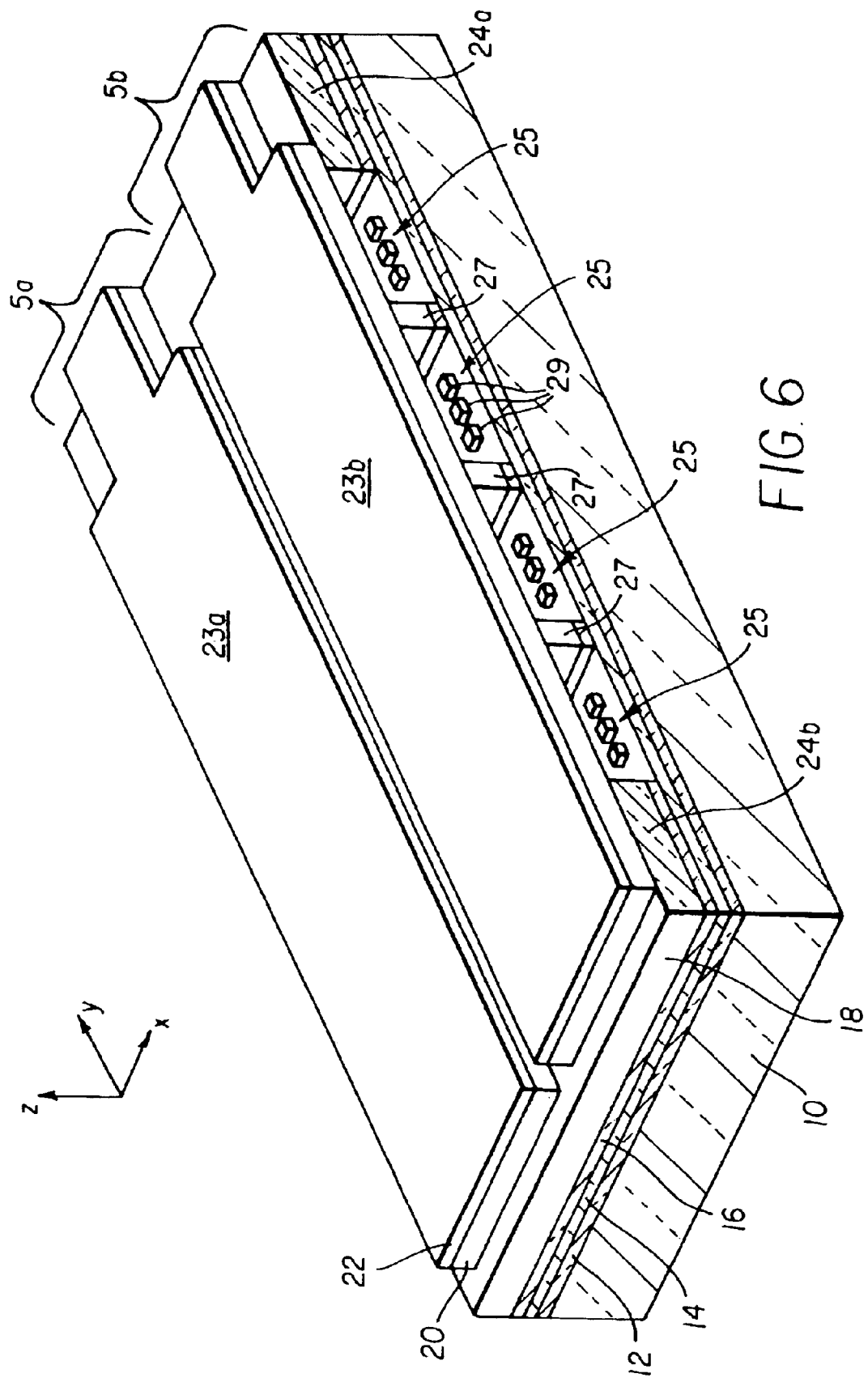
FIG. 6 is a perspective, partially cut-away view of two conformal GEMS devices in a linear array.

The conformal Grating Electromechanical System (GEMS) devices disclosed in '663 are illustrated in FIGS. 6 through 9. FIG. 6 shows two side-by-side conformal GEMS devices 5a and 5b in an unactuated state. The conformal GEMS devices 5a and 5b are formed on top of a substrate 10 covered by a bottom conductive layer 12, which acts as an electrode to actuate the devices 5a, 5b. The bottom conductive layer 12 is covered by a dielectric protective layer 14 followed by a standoff layer 16 and a spacer layer 18. On top of the spacer layer 18, a ribbon layer 20 is formed which is covered by a reflective and conductive layer 22. The reflective and conductive layer 22 provides electrodes for the actuation of the conformal GEMS devices 5a and 5b. Accordingly, the reflective and conductive layer 22 is patterned to provide electrodes for the two conformal GEMS devices 5a and 5b. The ribbon layer 20, preferably, comprises a material with a sufficient tensile stress to provide a large restoring force. Each of the two conformal GEMS devices 5a and 5b has an associated elongated ribbon element 23a and 23b, respectively, patterned from the reflective and conductive layer 22 and the ribbon layer 20. The elongated ribbon elements 23a and 23b are supported by end supports 24a and 24b, formed from the spacer layer 18, and by one or more intermediate supports 27 that are uniformly separated in order to form equal-width channels 25. The elongated ribbon elements 23a and 23b are secured to the end supports 24a and 24b, and to the intermediate supports 27. A plurality of standoffs 29 is patterned at the bottom of the channels 25 from the standoff layer 16. These standoffs 29 reduce the possibility of the elongated ribbon elements 23a and 23b sticking when actuated.

Figure 7:
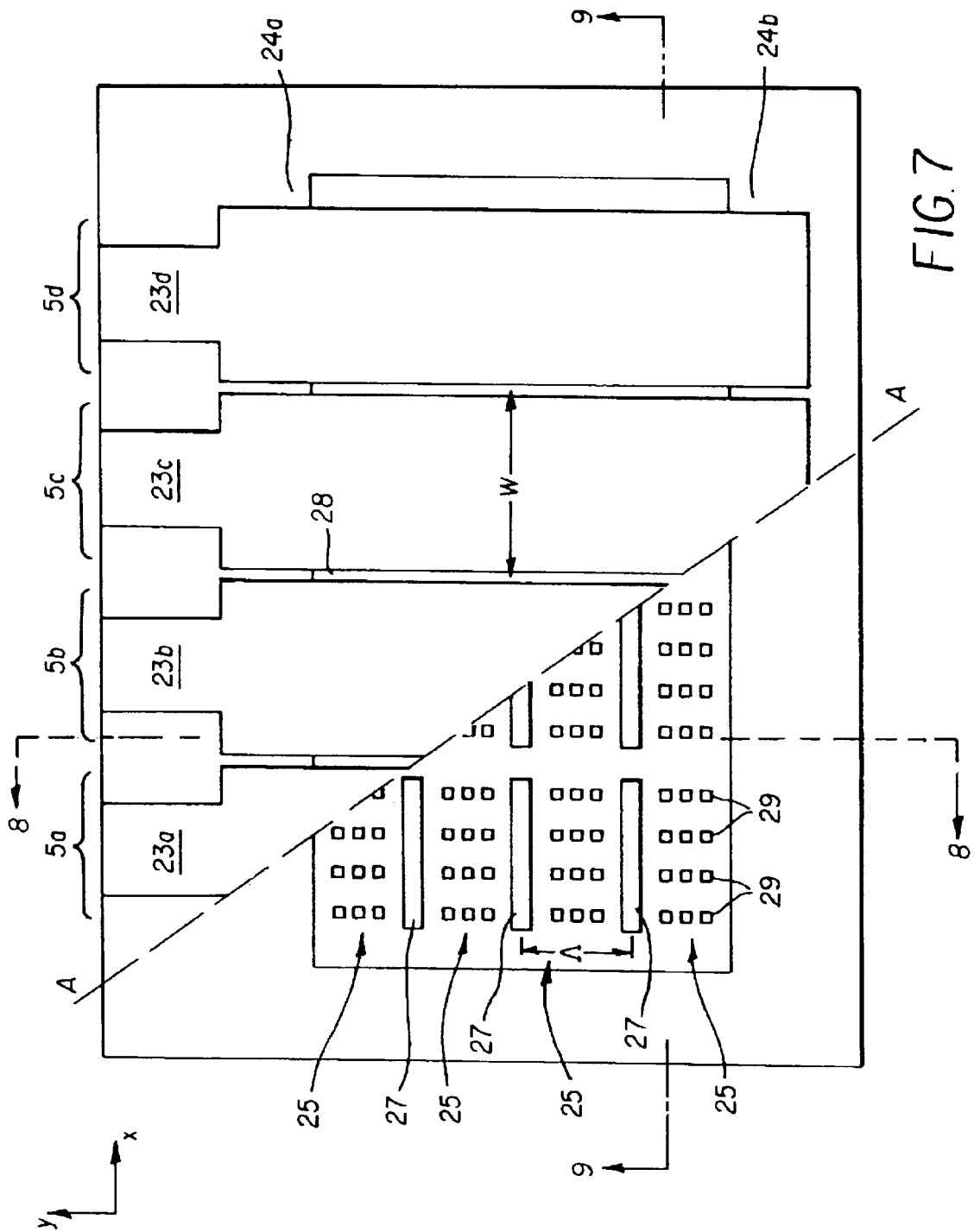
FIG. 7 is a top view of four conformal GEMS devices in a linear array.

A top view of a four-device linear array of conformal GEMS devices 5a, 5b, 5c and 5d is shown in FIG. 7. The elongated ribbon elements 23a, 23b, 23c, and 23d are depicted partially removed over the portion of the diagram below the line A—A in order to show the underlying structure. For best optical performance and maximum contrast, the intermediate supports 27 should preferably be completely hidden below the elongated ribbon elements 23a, 23b, 23c, and 23d. Therefore, when viewed from the top, the intermediate supports 27 should not be visible in the gaps 28 between the conformal GEMS devices 5a–5d. Here, each of the conformal GEMS devices 5a–5d has three intermediate supports 27 with four equal-width channels 25. The center-to-center separation A of the intermediate supports 27 defines the period of the conformal GEMS devices in the actuated state. The elongated ribbon elements 23a–23d are mechanically and electrically isolated from one another, allowing independent operation of the four conformal GEMS devices 5a–5d. The bottom conductive layer 12 of FIG. 6 can be common to all of the conformal GEMS devices 5a–5d.

FIG. 8a is a side view, through line 8—8 of FIG. 7, of two channels 25 of the conformal GEMS device 5b in an unactuated state. FIG. 8b shows the same view for an actuated state. For operation of the device, an attractive electrostatic force is produced by applying a voltage difference between the bottom conductive layer 12 and the reflective and conductive layer 22 of the elongated ribbon element 23b. In the unactuated state (see FIG. 8a), with no voltage difference, the ribbon element 23b is suspended flat between the supports. In this state, an incident light beam 30 is primarily reflected into a 0th order light beam 32, as in a simple planar mirror. To obtain the actuated state, a voltage is applied to the conformal GEMS device 5b, which deforms the elongated ribbon element 23b and produces a partially conformal GEMS with period A. FIG. 5b shows the device 5b (as shown and described in FIGS. 6 and 7) in the fully actuated state with the elongated ribbon element 23b in contact with standoffs 29. The height difference between the bottom of element 23b and the top of the standoffs 29 is chosen to be approximately ¼ of the wavelength λ of the incident light. The optimum height depends on the specific conformal shape of the actuated device. In the actuated state, the incident light beam 30 is primarily diffracted into the +1 st order light beam 35a and −1st order light beam 35b, with additional light diffracted into the +2nd order 36a and −2nd order 36b. A small amount of light is diffracted into even higher orders and some light remains in the 0th order. In general, one or more of the various beams can be collected and used by an optical system, depending on the application. When the applied voltage is removed, the forces due to tensile stress and bending restores the ribbon element 23b to its original unactuated state, as shown in FIG. 8a.

FIGS. 9a and 9b show a side view through line 9—9 of FIG. 7 of the conformal GEMS device 5b in the unactuated and actuated states, respectively. The conductive reflective ribbon element 23b is suspended by the end support 24b and the adjacent intermediate support 27 (not shown in this perspective). The application of a voltage actuates the device as illustrated in FIG. 9b.

Figure 10:
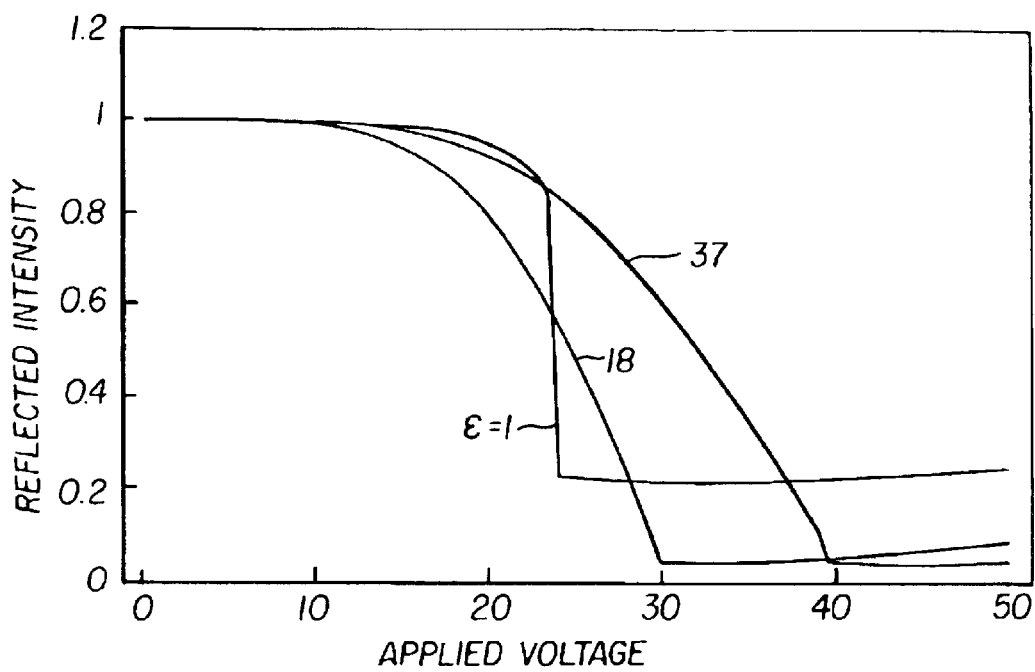
FIG. 10 shows theoretical plots of the reflected light intensity as a function of applied voltage for a conformal GEMS device, comparing various liquids to a gas atmosphere.
Figure 11:
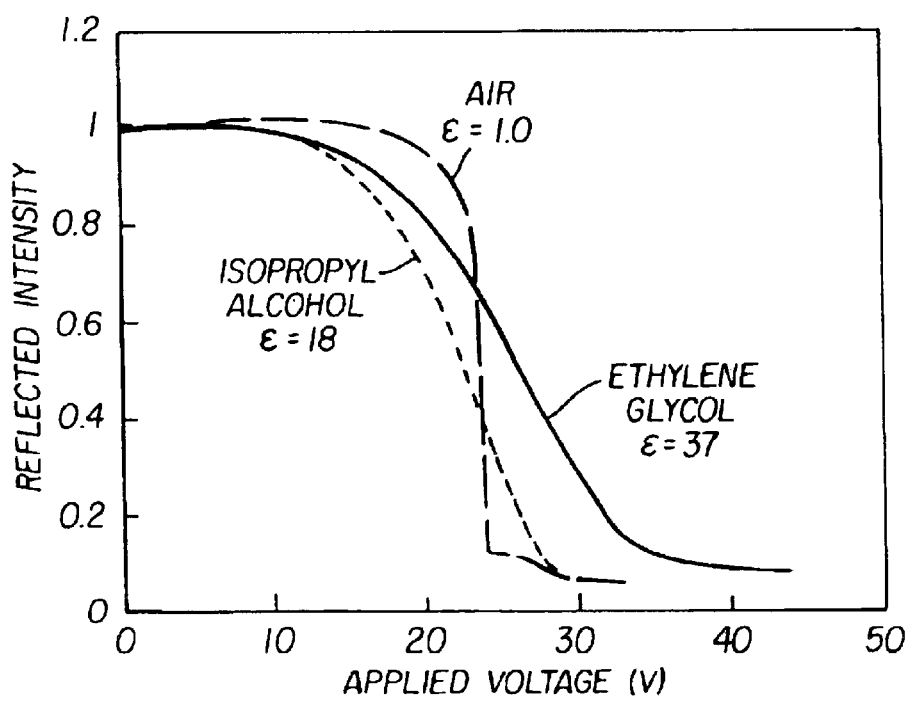
FIG. 11 shows experimental plots of the reflected light intensity as a function of applied voltage for a conformal GEMS device, comparing various liquids to a gas atmosphere.

FIGS. 10 and 11 illustrate the application of the present invention to remove the pull-down and release instabilities in a conformal GEMS device. With these instabilities eliminated, it is possible to control the diffracted or reflected light intensity in a continuous manner by varying the voltage applied to the device. The channels 25 are filled with a transparent liquid that can withstand high electric fields. In addition to providing continuously variable control of light intensity, the liquid increases the effective optical depth of the actuated conformal GEMS device and, therefore, reduces the required travel range of the ribbon elements. For example, the travel range needed to minimize the 0th order light beam 32 or to maximize diffraction into the non-zero diffracted orders (+$1^{st}$ order 35a, −1st order 35b, +2nd order 36a, −2nd order 36b, or even higher orders) is reduced by the refractive index $\lambda/4n$ of the liquid. Specifically, for maximum diffraction into the +$1^{st}$ order 35a and −1st order 35b, the required travel range is reduced to approximately $\lambda/4n$ in liquid from approximately $\lambda/4$ in a gas atmosphere. In practice, since the refractive index of many liquids is near 1.4, the required travel range is reduced by approximately 30%.

Referring to FIG. 10, the theoretical response of a conformal GEMS device to applied voltage is shown, comparing a gas atmosphere to immersion in liquids. The curves in FIG. 10, which represent the normalized intensity of the $0^{th}$ order reflected light beam, illustrate the elimination of the pull-down instability. With a gas atmosphere, $\in=1.0$, pull-down occurs near 24V. At the pull-down voltage, the normalized reflected intensity drops significantly and dramatically from about 0.85 to about 0.22. Further increases in voltage only produce small differences in intensity because the ribbon elements are in contact with the underlying standoffs with voltages above 24V. For liquids with relatively large dielectric constants, a smooth, more controlled reduction in reflected intensity as a function of applied voltage is expected. Indeed, the curves for liquids with $\in=18.0$ and $\in=37.0$ show that it is theoretically possible to obtain continously variably control of the reflected light intensity. The larger dielectric constant, $\in=37.0$, reduces the sensitivity of intensity to voltage and, therefore, improves controllability. However, the larger dielectric constant also increases the required voltage.

Referring to FIG. 11, the actual response of a conformal GEMS device immersed in known substances with different dielectric constants is shown to closely follow the theoretical expections disclosed in FIG. 10 above. As expected, a device in air, which has a dielectric constant of 1.0, exhibits a sharp pull-down instability of the ribbon elements at approximately 24V. In contrast, Isopropyl Alcohol, having a dielectric constant of 18, provides a significantly increased control of the ribbon elements as voltage is applied. Ethylene Glycol, having a dielectric constant of 37, further reduces the sensitivity to applied voltage, thereby providing more precise control. The response of a conformal GEMS device immersed in several other liquids (not shown in FIG. 11) was also characterized, for example, in Isopar® manufactured by Exxon Mobil and in methanol. Isopar®, with a dielectric contant of 2, increased the travel range, but did not completely eliminate the pull-down instability. Methanol, however, caused problems because of the occurrence of electrochemical reactions.

A robust implementation of the invention requires careful selection of both the applied voltage waveform and the liquid. As disclosed by Kowarz et al. in U.S. Pat. No. 6,144,481, entitled Method and System for Actuating Electro-Mechanical Ribbon Elements in Accordance to a Data Stream, issued Nov. 7, 2000, a bipolar voltage waveform reduces charging in electromechanical ribbons. Furthermore, as described by Gooray et al. in U.S. Pat. No. 6,419,335, Electronic Drive Systems and Methods, issued Jul. 16, 2002, a high-frequency bipolar waveform used in conjunction with a liquid-filled electrostatic MEMS device reduces electrochemical reactions and dielectric breakdown of the liquid. To obtain the results shown in FIG. 11, a 4 MHz bipolar voltage waveform with a constant RMS (root-mean-squared) value was used to actuate the conformal GEMS device. Because of the viscous damping introduced by the liquid, the ribbon elements do not respond to the high frequency and only respond to the RMS value. Therefore, the high frequency component does not show up in the optical response.

The invention has been described in detail with particular reference to certain preferred embodiments thereof, but it will be understood that variations and modifications can be effected within the spirit and scope of the invention.

PARTS LIST 2a tensile ribbon element
2b tensile ribbon element
2c tensile ribbon element
4 channel
5a conformal gems device
5b conformal gems device
5c conformal gems device
5d conformal gems device
6 first electrode
7 dielectric ribbon material
9 conducting substrate
10 substrate
12 bottom conductive layer
14 dielectric protective layer
16 standoff layer
18 spacer layer
20 ribbon layer
22 reflective and conductive layer
23a elongated ribbon element
23b elongated ribbon element
23c elongated ribbon element
23d elongated ribbon element
24a end support
24b end support
25 channel
27 intermediate support
28 gap
29 standoff
30 incident light beam
32 $0^{th}$ order light beam
35a $+1^{st}$ order light beam
35b $-1^{st}$ order light beam
36a $+2^{nd}$ order light beam
36b $-2^{nd}$ order light beam

What is claimed is:

1. An electromechanical grating device with a reduced actuation voltage for modulating incident light comprising:
    a) a movable member having a first electrode;
    b) an opposing surface having a second electrode;
    c) a channel separating the movable member from the opposing surface, wherein, to change a state of actuation of the electromechanical grating device, the movable member is displaced into the channel by applying an actuation voltage between the first electrode and the second electrode; and
    d) a transparent liquid situated in the channel for reducing the actuation voltage applied to the movable member.

2. The electromechanical grating device claimed in claim 1, wherein at least one solid dielectric layer is physically situated between the first electrode and the second electrode.

3. The electromechanical grating device claimed in claim 1, wherein as a result of the actuation voltage, the movable member is displaced by approximately $\lambda/4n$, where n is a refractive index of the liquid and $\lambda$ is the wavelength of the incident light.

4. The electromechanical grating device claimed in claim 1, wherein a dielectric constant of the transparent liquid is larger than 2.

5. The electromechanical grating device claimed in claim 1, wherein the electromechanical grating device is a GEMS device.

6. The electromechanical grating device claimed in claim 1, wherein the electro-mechanical grating is a grating light valve.

7. The electromechanical grating device claimed in claim 1, wherein the transparent liquid surrounds the movable member, in addition to being situated in the channel.

8. The electromechanical grating device claimed in claim 1, wherein the liquid is isopar.

9. A liquid-immersed electromechanical grating device with a reduced actuation voltage for modulating incident light with a wavelength $\lambda$, comprising:

a) a movable member having a first electrode;
b) an opposing surface having a second electrode;
c) a channel separating the movable member from the opposing surface, wherein, to change a state of actuation of the liquid-immersed electromechanical grating device, the movable member is displaced into the channel by applying an actuation voltage between the first electrode and the second electrode; and
d) a liquid situated in the channel, wherein the liquid has a sufficiently high dielectric constant so as to reduce the actuation voltage of the liquid-immersed electromechanical grating device as compared to a reference electromechanical grating device for also modulating incident light having a wavelength $\lambda$, wherein the reference electromechanical grating device includes a gas-filled channel.

10. The liquid-immersed electromechanical grating device claimed in claim 9, wherein the channel of the liquid-immersed electromechanical grating device has a significantly shallower channel depth than the gas-filled channel of the reference electromechanical grating device.

11. The liquid-immersed electromechanical grating device claimed in claim 10, wherein the channel depth of the liquid-immersed electromechanical grating device is reduced by at least 20% compared to the gas-filled channel of the reference electromechanical grating device.

12. The liquid-immersed electromechanical grating device claimed in claim 9, wherein the actuation voltage of the liquid-immersed electromechanical grating device is reduced by at least 20% compared to the actuation voltage of the reference electromechanical grating device.

13. The liquid-immersed electromechanical grating device claimed in claim 9, wherein at least one solid dielectric layer is physically situated between the first electrode and the second electrode.

14. The liquid-immersed electromechanical grating device claimed in claim 9, wherein as a result of the applied voltage, the movable member is displaced by approximately $\lambda/4n$, where n is a refractive index of the liquid.

15. The liquid-immersed electromechanical grating device claimed in claim 9, wherein the liquid is transparent.

16. The liquid-immersed electromechanical grating device claimed in claim 9, wherein a dielectric constant of the transparent liquid is larger than 2.

17. The liquid-immersed electromechanical grating device claimed in claim 9, wherein the electromechanical grating device is a GEMS device.

18. The liquid-immersed electromechanical grating device claimed in claim 9, wherein the electromechanical grating is a grating light valve.

19. A liquid-immersed electromechanical grating device with a reduced actuation voltage for modulating incident light, comprising:
a) a movable member having a first electrode;
b) an opposing surface having a second electrode;
c) a channel separating the movable member from the opposing surface, wherein, to change a state of actuation of the electromechanical grating device, the movable member is displaced into the channel;
d) a liquid situated in the channel; and
e) means for applying a high frequency bipolar voltage waveform between the first and second electrodes to displace the movable member.

20. The liquid-immersed electromechanical grating device claimed in claim 19, wherein the liquid provides viscous damping that causes the movable member to be insensitive to a high frequency component of the high frequency bipolar waveform.

21. The liquid-immersed electromechanical grating device claimed in claim 20, wherein the high frequency component is greater than 1 MHz.

22. The liquid-immersed electromechanical grating device claimed in claim 19, wherein a high frequency component of the high frequency bipolar waveform eliminates breakdown of the liquid.

23. The liquid-immersed electromechanical grating device claimed in claim 19, the liquid is transparent.

24. The liquid-immersed electromechanical grating device claimed in claim 19, wherein, as a result of the high frequency bipolar voltage waveform, the movable member is displaced by approximately $\lambda/4n$, where n is a refractive index of the liquid.

* * * * *